United States Patent [19]
Lee et al.

[11] Patent Number: 5,648,660
[45] Date of Patent: Jul. 15, 1997

[54] METHOD AND APPARATUS FOR REDUCING NOISE IN A RADIATION CAPTURE DEVICE

[75] Inventors: Denny Lap Yen Lee, West Chester, Pa.; Eugene Francis Palecki, Wilmington, Del.; Cornell Lee Williams, Pennsauken, N.J.

[73] Assignee: Sterling Diagnostic Imaging, Inc., Newark, Del.

[21] Appl. No.: 583,256

[22] Filed: Jan. 5, 1996

[51] Int. Cl.$^6$ ............................................. H01L 27/146
[52] U.S. Cl. ................................................. 250/370.09
[58] Field of Search ....................................... 250/370.09

[56] References Cited

U.S. PATENT DOCUMENTS

| | | | |
|---|---|---|---|
| 5,138,567 | 8/1992 | Mehrgardt | 364/724.01 |
| 5,140,162 | 8/1992 | Stettner | 250/370.09 |
| 5,151,947 | 9/1992 | Nagatsuka et al. | 382/6 |
| 5,198,673 | 3/1993 | Rougeot et al. | 250/370.11 |
| 5,252,480 | 10/1993 | Tran | 437/2 |
| 5,262,649 | 11/1993 | Antonuk et al. | 250/370.09 |
| 5,268,967 | 12/1993 | Jang et al. | 382/6 |
| 5,297,036 | 3/1994 | Grimaud | 364/413.13 |
| 5,319,206 | 6/1994 | Lee et al. | 250/370.09 |
| 5,331,179 | 7/1994 | Lee et al. | 250/591 |
| 5,384,865 | 1/1995 | Loveridge | 382/54 |
| 5,528,043 | 6/1996 | Spivey et al. | 250/370.09 |

OTHER PUBLICATIONS

Senda et al, "Two–Dimensional Photosensor Using Amorphous Si Pin Diode", *Trans. Inst. Electron. Commun. Eng. Japan.* vol. 69, 1986 no month.

Springer Verlac, The Physics of a New Direct Digital X–Ray Detector (Lee/Jeromin/Dheung), *computer Assisted Radiology,* 83–88, 1995, Berlin no month.

Denny L. Lee et al., "Projection Radiography Using a Direct Conversion Imaging Array," Paper Presented at 81st Scientific Assembly and Annual Meeting of the Radiological Society of North America, 1995, Chicago (abstract only) no month.

Lawrence K. Cheung et al., "the Physics of Selenium in a Direct Conversion X–Ray Imager," Paper Presented at 81st Scientific Assembly and Annual Meeting of the Radiological Society of North America, 1995, Chicago (abstract only) no month.

Lothar S. Jeromin et al., "Productivity Improvements with a Direct Radiography System," Paper Presented at 81st Scientific Assembly and Annual Meeting of the Radiological Society of North America, 1995, Chicago (abstract only) no month.

Lawrence K. Cheung et al., "Direct Radiography System: Physical Principle and Phantom Images," Scientific Exhibit Presented at 81st Scientific Assembly and Annual Meeting of the Radiological Society of North America, 1995, Chicago (abstract only) no month.

John C. Russ, "Correcting Imaging Defects: Neighborhood Ranking," *The Image Processing Handbook,* 64–69, 1992, CRC Press, Boca Raton no month.

Jae S. Lim, "Noise Smoothing: Image Enhancement," *Two–Dimensional Signal and Image Processing,* 469–476, 1990, Prentice–Hall, Inc., New Jersey no month.

*Primary Examiner*—Constantine Hannaher
*Attorney, Agent, or Firm*—Ratner & Prestia

[57] ABSTRACT

A process and related apparatus for reducing noise due to addressing and switching the detection elements in a radiation detecting panel comprising an array of detection elements. Noise reduction is achieved in two steps, first by the use of a sample and hold circuit which compares a first signal indicative of switching noise held in a sample and hold circuit with a second signal which includes the switching noise and the desired data signal. The second step includes further reducing noise in the output signal present during readout of the detection elements by comparing the signal from certain elements in the array which have not been exposed to radiation with the signal from the exposed elements in the array to obtain an output with significantly reduced noise.

37 Claims, 4 Drawing Sheets

METHOD AND APPARATUS FOR REDUCING NOISE IN A RADIATION CAPTURE DEVICE

BACKGROUND OF THE INVENTION

1. Field of the Invention

This invention relates to noise reduction in reading out data from radiation detecting elements and more particularly to a process and related apparatus for reducing noise primarily due to addressing and switching circuitry in a radiation detecting panel comprising a plurality of detecting elements.

2. Description of Related Art

Capturing radiation and obtaining an electronic signal representative of the intensity of the radiation directly, is well known. The development, relatively recently, of large scale integration and thin film transistor technology, has made it possible to make direct radiation capture elements, in which the radiation intensity is captured in minute detectors and stored in the form of an electrical charge, which is subsequently read-out and converted to an electronic signal. A plurality of such may be used to form a detection panel, wherein the individual detection element signals may be assembled into a composite signal which may be displayed to produce a visible image corresponding to a modulated radiation intensity pattern.

A detailed description of at least one such radiation detecting element for detecting X-ray radiation, and a radiation detecting panel comprising a plurality of such elements is given in a chapter by Denny L. Lee, Lothat S. Jeromin, and Lawrence K. Cheung entitled "The physics of a new Direct Digital X-ray Detector" in a book by Springer Verlac, entitled Computer Assisted Radiology, published in 1995 in Berlin, and in U.S. Pat. Nos. 5,319,206 and 5,331,179, issued to Lee et al. on Jun. 7, and Jul. 19, 1994 respectively.

Radiation capture elements of the type described in the above references, typically include a radiation sensor which generates a charge proportional in magnitude to the incident radiation, and include means for storing and reading out the charge. The read-out means again typically provide switching and multiplexing circuitry which is used to transfer the generated charges from the capturing element to a charge conversion circuit where these charges produce an electrical radiation data signal which may be further manipulated as needed to generate a visible image.

Typical prior art read-out circuitry comprises an integrating amplifier connected to the element charge storage means which is often a capacitor, through a switch which is typically an FET transistor accessible from outside the element, to permit turning it on and off at will. The amplifier also includes an enable/reset switch which permits to discharge any charges stored in the integrating circuit prior to receiving and integrating the charges from the element following exposure to radiation.

A problem with integrating amplifiers and enable/reset switches is that the switching action itself to enable the amplifier following resetting, generates a noise signal which is integrated in the amplifier and which is added to the subsequent radiation data signal generated by the integration of the stored charges in the charge storage means in the detecting element. We shall refer to this noise signal as the enable/reset noise. Thus the output of the integrating amplifier contains both the radiation data signal from the element and the noise signal from the enable/reset switch, the latter being an undesirable component. Addressing and switching the switch or switches in an element, or in a plurality of elements, as the case may be, to transfer the charge from the detection element to the integrating amplifiers, is usually done by the application of a trigger voltage pulse to the gate of an FET transistor forming the switch. This activity results in a second type of noise from a combination of sources, some relating to the panel structure, some to each switch structure, and some to differences in the exact timing structure of the line addressing gate pulses which are not absolutely identical in each occurrence.

We refer to these row related noise signals collectively as the common mode row noise signal or in short the common mode noise. This common mode noise is a second undesirable component in the output of the integrating amplifier, which needs elimination in order to obtain a noise free radiation exposure data signal from the detecting element.

It is also well known in the art to enhance radiogram images to improve diagnostic performance by eliminating noise. However, this has generally been done by analyzing the entire data set of an image, or of a desired image region. Typically this is done by taking a histogram of the image data, including noise, and adjusting the gradation processing conditions so that the portions corresponding to 5% and 95% are assigned minimum and maximum output signal values, respectively.

Other attempts to minimize noise include segmenting the desired region in a digital radiographic image from foreground regions which have received very little radiation due to the use of radiation limiting elements, for example collimator blades used to define the size and shape of the radiation field or pattern and from background regions which are regions of direct radiation exposure around the body part being examined. Image data in the radiographic image are identified using edge detection techniques and subsequently assigned to a block which is empirically defined as foreground/background or object. In subsequent image enhancement calculations, foreground/background blocks are not included in the calculation of enhancement parameters. This process is calculation intensive and is practiced on an overall digital radiographic image basis but does not account for common mode noise, or enable/reset switch noise.

There is thus still need for circuitry, systems, and read-out methods which can effectively isolate and eliminate such enable switch and common mode noise components in the radiation data signal, obtained from radiation detecting elements which convert incident radiation to stored electrical charges and signals.

SUMMARY OF THE INVENTION

It is an object of the present invention to solve the aforementioned problems and to this effect, there is provided a detector comprising an event detection element, a read-out module and a control signal source, the detection element comprising:

a sensor, a charge accumulator connected to the sensor, and a read-out switch connected to the charge accumulator,
the read-out module comprising:

an amplifier including a reset/enable switch, a first sample and hold circuit for selectively sampling and holding said amplifier output a first time, and optionally a second such sample and hold circuit; and the control signal source comprising: a control signal generator generating 1) a read-out switch actuating signal
ii) an amplifier reset/enable switch actuating signal and
iii) a sample and hold signal.

There is further provided according to the present invention detection panel comprising a plurality of detection elements, a plurality of read-out modules and a control signal source all in accordance with claim 2, wherein, the plurality of detection elements is arranged in rows and columns and wherein the plurality of elements in each column are all connected to one read-out module and the plurality of elements in each row are all connected to a common gate line, and wherein an output of the read-out module comprises a first sample and hold output and a second sample and hold output.

Still according to this invention the panel may comprise at least one and preferably a plurality of detection elements which have been either shielded from incident radiation or rendered insensitive to incident radiation. When a plurality of such elements are rendered insensitive or shielded from radiation, it is preferred that they form at least one and preferably three columns of elements.

It is a further object of this invention to provide a method for removing a noise component in reading radiation exposure data stored in a charge accumulator of a radiation detection element of a detector comprising the detection element, a read-out module and a control signal source, wherein the detection element also includes a read-out switch, and wherein the read-out module comprises a charge integrating amplifier, and an enable/resetting switch associated with said amplifier, the method comprising:

A) Addressing the enable/reset switch with a first, enable signal allowing said integrating amplifier to integrate any charge at its input, and while said enable switch remains enabled, B) Sampling and storing the output of said integrating amplifier as a first sample and hold signal;

C) transferring any accumulated charges from said charge accumulator to the integrating amplifier;

D) Terminating the transfer of said charges and again sampling the integrating amplifier output to obtain an amplifier output, and E) subtracting the first sample and hold signal from the amplifier output to obtain a data read-out signal indicative of the relative intensity of the radiation exposure of the element and substantially free of enable/reset switching noise.

It also an object of the present invention to provide a method for removing noise components in reading radiation exposure data stored in a charge accumulator of a radiation detection element of a detection panel comprising a plurality of detection elements arranged in a plurality of rows and columns, wherein the detection element also includes a readout switch having an actuating gate and a data electrode, the gate electrodes of all switches in a row connected to a gate line and the data electrodes of all read out switches in a column connected to a data line, the data line connecting each column to a read-out module each module comprising a charge integrating amplifier, and an enable/resetting switch associated with said amplifier, the method comprising:

A) addressing the enable/reset switches of all read-out modules with a first, enable signal allowing each of said integrating amplifiers to integrate any charge at its input, and while said enable switch remains enabled, B) Sampling and storing the output of said integrating amplifier as a first sample and hold signal for each read-out module;

C) transferring any accumulated charges from said charge accumulators in all elements in a row to the integrating amplifiers of the read-out modules in each column;

D) Terminating the transfer of said charges and again sampling the integrating amplifier outputs to obtain an amplifier output for each read-out module, and E) sequentially subtracting the first sample and hold signal from the amplifier output in each read-out circuit, to obtain a data read-out signal indicative of the relative intensity of the radiation exposure of the elements in a row, such signal being substantially free of enable/reset switching noise.

Still a further object of this invention is to provide a read-out signal from such a panel as described above which is also free from common mode noise. The process comprises in addition to the steps "A" through "E" herein above recited, further includes preventing radiation induced charges to accumulate in at least one column of detection elements, and wherein following subtraction of the first and second sampled signals in step "E", the signals from the read-out modules connected to such at least one column where there are no radiation induced charges, are segregated and are further processed to produce a common mode noise signal, and wherein in an additional step "E'" following step "E", said common mode noise signal is subtracted from each of the radiation data output of the read-out modules connected to the remaining columns, to produce a radiation data output free from both enable/reset switching noise and common mode noise.

BRIEF DESCRIPTION OF THE DRAWINGS

The invention can be more fully understood from the following description thereof in connection with the accompanying drawings described as follows.

DESCRIPTION OF THE PREFERRED EMBODIMENT

Figure 1:
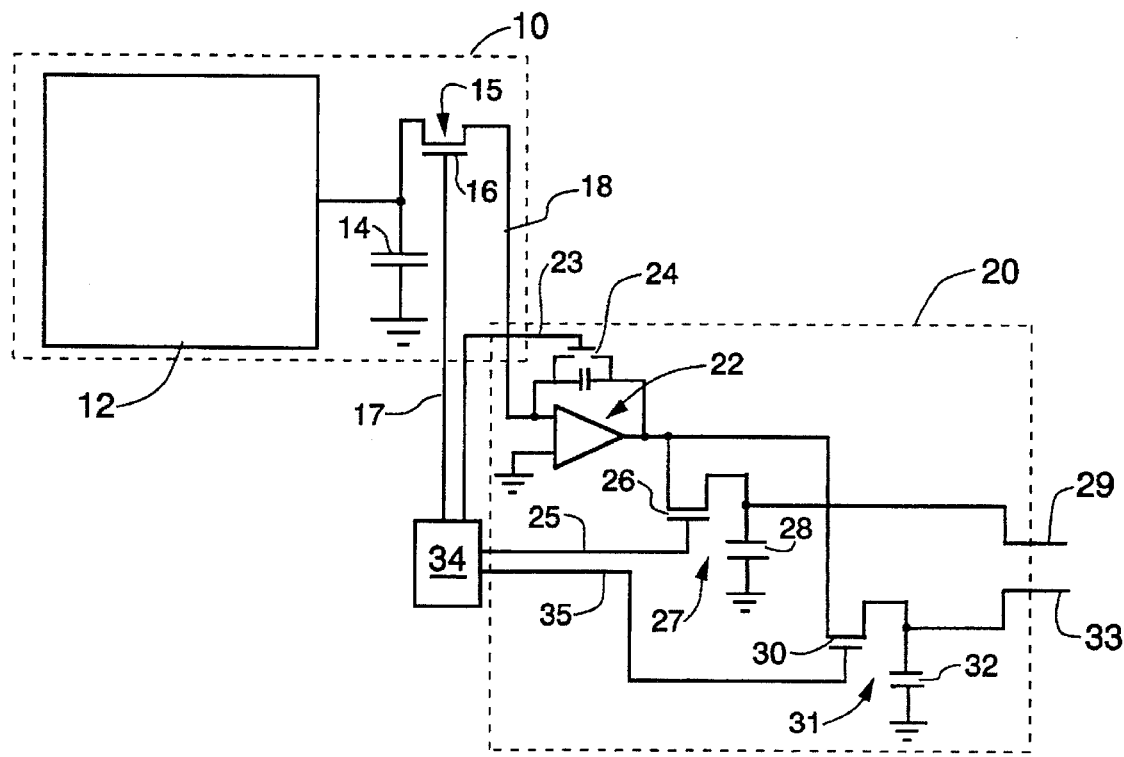
FIG. 1 is a schematic representation of a radiation detecting element connected to a switching noise reducing read-out circuit in accordance with the present invention.

Throughout the following detailed description, similar reference characters refer to similar elements in all figures of the drawings.

Referring now to FIG. 1 there is shown in schematic representation a radiation detecting element and associated read-out module 20.

The radiation detecting element 10, comprises a sensor 12. Sensor 12 is connected to charge accumulator 14, typically a capacitor. A switch 15, usually an FET and preferably a thin film transistor is connected to the charge accumulator 14 and a data read-out line 18. The FET switch is actuated through a gate address line 17, which permits turning the FET switching transistor on and off by application of an actuating signal external to the element, such as a voltage pulse.

Read-out line 18 connects the detecting module 10 to a read out module 20. Read-out module 20 includes an integrating amplifier 22 and an enable/reset switch 24. Switch 24 may be actuated from outside the read-out module 20 over line enable/reset switch 23. Such integrating amplifier arrangements are well known in the art and require no further detailed description.

The output of the integrating amplifier is connected to a first sample and hold circuit 27 and to a second sample and hold circuit 31 through a first sample and hold switch 26 and a second sample and hold switch 30. Switches 26 and 30 are preferably also FET switches whose gates are addressed from outside the module over lines 25 and 35 respectively. The first and second sample and hold circuit output is accessed over lines 29 and 33 respectively.

Figure 2:
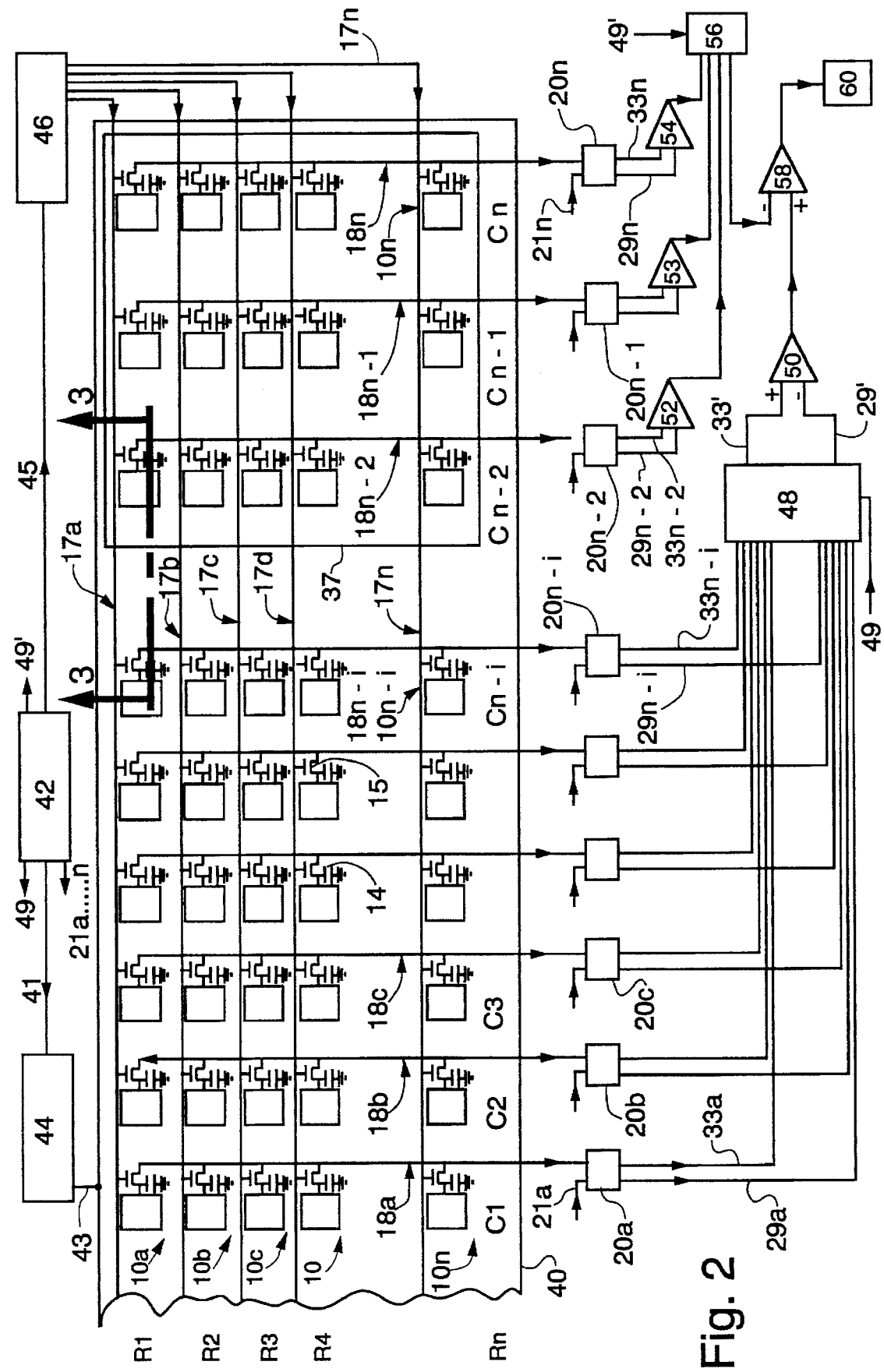
FIG. 2 is a schematic representation of one embodiment of a radiation detecting panel and noise reduction circuitry for reducing noise in accordance with the present invention.

Referring next to FIG. 2 there is shown a plurality of radiation detecting elements 10a, 10b, 10c . . . 10n of the type shown in FIG. 1, arranged in a plurality of rows R1, R2, R3, R4, . . . Rm and in a plurality of columns C1, C2, C3, . . . Cn-i, . . . Cn-2, Cn-1, Cn, to form a radiation detecting panel 40.

(Cn-i represents the last column i numbers prior to a column of elements rendered insensitive to radiation through construction or shielding. Here where three columns are shown shielded, i=3).

The radiation elements in each column have their data read-out lines 18 interconnected to form common column data lines 18a, 18b, 18c, . . . 18n-i . . . 18n-2, 18n-1, 18n. The data lines are each connected to read-out modules 20a, 20b, 20c, . . . 20n-i, . . . 20n-2, 20n-1, 20n, respectively providing one readout module for each column.

In the embodiment illustrated in FIG. 2, and in the description of the operation of this invention, the switch 15 used to transfer the charge from the detection element accumulator 14 to the read-out module 20 is preferably an FET transistor switch. This is preferred but not essential, and other switching methods may be used.

The gates 16 of each FET switch 15 in each row Rm are all connected to a common address line 17a, 17b, 17c, 17d, . . . 17m for each row, permitting the simultaneous addressing and actuation of all switches in a row by the application of a gate switching signal to the corresponding gate address line.

The sample and hold circuit output lines 29a and 33a, 29b and 33b, . . . 29n-i and 33n-i, from readout modules 20a through 20n-i, are connected to the input side of a read-out multiplexing circuit 48 which selectively addresses each pair of lines 29k and 33k (where k identifies a column and where 1<=k<=n-i) and connects them to multiplexor 48 output lines 29' and 33' Lines 29' and 33' are connected to a first, enable/reset noise first subtracting circuit 50, which may be a operational amplifier. The output of the first subtracting circuit 50 is in turn preferably connected to the input of a second common mode noise subtracting circuit 58, which may also a operational amplifier.

The panel 40 includes a shield 37 which as illustrated is shown to cover three columns of elements 10, identified as columns Cn-2, Cn-1 and Cn. This is a preferred arrangement, but as few as a single column or more than three columns may be shielded, in practicing the present invention.

The output lines 29n-2 and 33n-2, 29n-1 and 33n-1, and 29n and 33n from the read-out modules connected to the shielded columns are each connected to a subtracting circuit 52, 53 and 54 respectively. The output of subtracting circuits 52, 53 and 54 is connected to a logic circuit 56. The logic circuit 56 output is directed to a second input of the common mode noise second subtracting circuit 58.

The output of second subtracting circuit 58 is connected to the input of a storage and display electronics 60, used to store, reconstruct and display an image corresponding to the radiation data representing an intensity pattern of radiation incident to and captured by the panel 40. Such electronics may vary depending on the particular end use desired for the data captured by the panel. Typically the electronics 60 will comprise an analog to digital converter, a CPU, a memory, and a display. All such elements are well known in the art and not the subject of the present invention.

Associated with the panel there is a control circuit 42 which controls the different functions necessary for the operation of the panel as will be described later in this application.

Connected to the control circuit 42, over line 41 is a programmable power supply 44 which is connected to the panel over line 43, as described below. Also connected to the controller through line 45 is a gate addressing multiplexing circuit 46. The output of this gate multiplexor 46 is connected to gate address lines 17a . . . 17m.

Control circuit 42 is also connected to read-out multiplexing circuit 48 through control line 49 and to the read-out modules 20a . . . 20n through lines 21a . . . 21n. Each line 21 comprises lines 23, 25 and 35 identified earlier in the description of the element and read-out module of FIG. 1. The control circuit 42 is also connected to the selection logic circuit 56, which may include a sample and hold circuit in addition to logic circuits for selecting a signal representing the common mode noise, through line 49'.

Control circuit 42 is depicted in this illustrative embodiment of the present invention as a control which is separate from the CPU included in block 60. This is done primarily for ease of identification and description of the significant elements needed for the performance of this invention. It is well within the scope of the present invention to substitute for the circuit 42 a programmed computer which is the same computer used in receiving storing and displaying the output data from the panel. Further more while this embodiment is fundamentally an analog signal processing system, this is not an essential limitation. It is possible for instance to provide an analog to digital (A to D) converter at any point after the charge integrator, and perform the functions of the analog circuitry depicted in a digital processing circuit, such as a properly programmed computer. A to D conversion of image data, data access and storage, sequential data addressing and retrieval, data display etc. using a computer, are all well known technology and there is no need for further description in the context of this invention, which, uses known circuitry in its implementation. Details are only supplied where such details are made necessary by the objectives of this invention.

Figure 3:
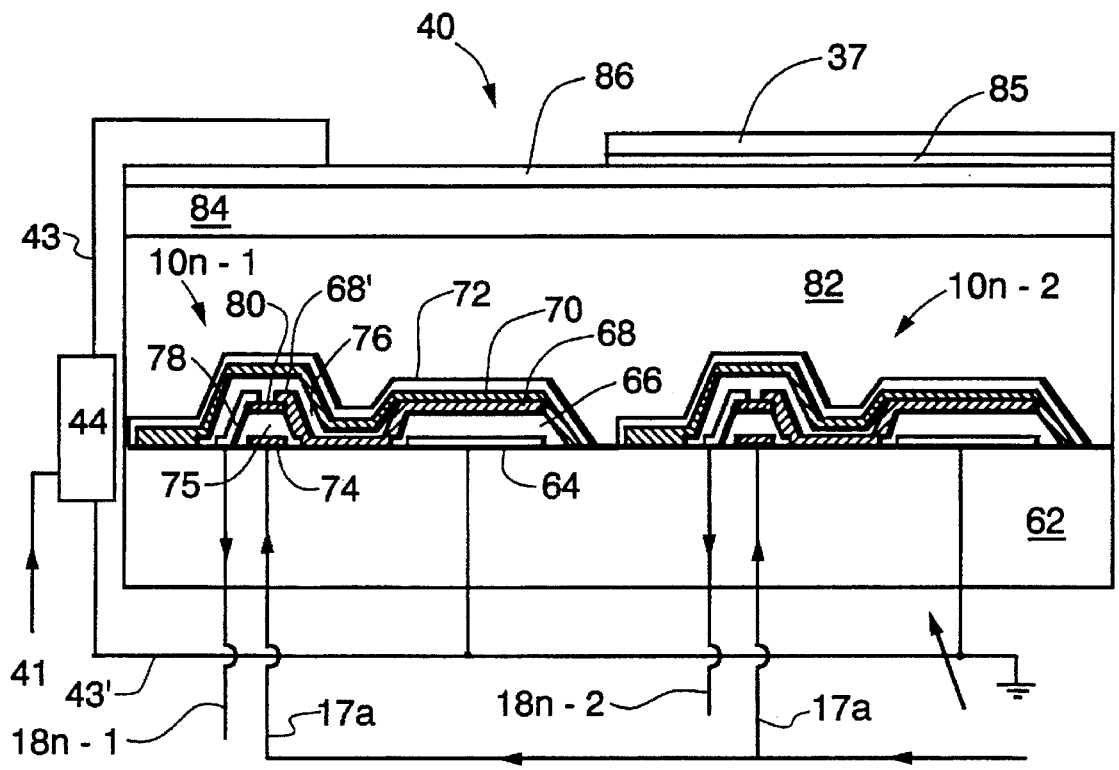
FIG. 3 is a schematic representation of a cross section of a portion of the panel shown in FIG. 2 along lines "3"—"3".

FIG. 3 shows in schematic illustration, an elevation cross section taken through the panel shown in FIG. 2 along arrows 3—3. While a more detailed description together with an explanation of the operation thereof, of this type of detection element and panel will be found in U.S. Pat. No. 5,319,206 the panel comprising a plurality of elements which is preferably used in this invention has a somewhat different structure, as is explained bellow. FIG. 3 shows a cross section of panel 60 encompassing two detection elements 10n-i and 10n-2, having identical structure. Only one will therefore be described. The elements are built on a non conductive support 62, which is preferably a glass support. In constructing each element of the panel on a surface of this glass support, which surface now becomes the inner surface, there is deposited a first conductive electrode 64. The electrode 64 is next covered with a dielectric layer 66. A second conductive electrode called a microplate 68 is placed over the dielectric 66. The microplate 68 together with the dielectric 66 and the conductive electrode 64 form a capacitor 14 which acts as the charge accumulator. Electrode 64 is connected to a common ground. An FET transistor is also constructed next to the charge accumulator for each detection element by depositing a gate electrode 74 on the glass support. A dielectric material 75 which is not shown in scale in this figure, is placed over the gate 74. A semiconductor 80, i.e. Amorphous Silicon, Cadmium Selenide, etc. is placed over the dielectric 75. A Source electrode 78 and a Drain electrode 68' are next connected to the semiconductor 80 to complete the transistor. Drain 68' is connected to microplate 68. A dielectric 76 insulates the transistor. The source 78 is accessible from outside the panel over lines 18n-i. Gate 74 is addressed over gate address line 17a. As shown in this figure, all the gate lines in the same row are interconnected.

Optionally but preferably a third conductive electrode is placed over the dielectric layer 76 and in contact with microplate 68 to form mushroom electrode 70. The presence of this electrode has no effect to the operation of this invention, however detection elements incorporating "mushroom" electrodes (as described in the article by Lee et) perform better, and are preferred as detectors. A protective insulating layer 72 is also preferably placed over electrode 70.

A photoconductive layer 82, typically Selenium, is next applied over the full panel and covers all elements therein. The photoconductive layer 82 is covered by a continuous, charge blocking, dielectric layer 84 which is in turn covered by a continuous top conductive electrode layer 86. Programmable power supply 44 is connected to this layer 86 through line 43. Power supply 44 is also connected through line 43' to a common ground to which electrodes 64 are also connected.

Dielectric layer 84 and conductive layer 86 are transparent to the radiation intended to be detected by the present panel.

As is seen in FIG. 3 (and also in FIG. 2) a portion of the panel is shielded from incident radiation with a shield 37.

Radiation shield 37 shields one and preferably three or more columns of elements 10, from incident radiation. Shield 37 preferably has the form of a continuous strip positioned at an outermost boundary of the panel as shown in FIG. 2, however, it is within the bounds of the present invention for the shield 37 to be positioned anywhere over the panel 40; in addition, the shield 37 may be replaced by one or more individual discrete radiation shielding elements positioned above radiation detection panel 40 to separately shield individual detection elements 10n in the columns. In an alternate embodiment, more than one continuous radiation blocking strip may be employed, the present invention only requiring that at least one, and preferably three or more elements 10n in each row be shielded from incident radiation.

Radiation shield 37 advantageously comprises about 0.5 millimeter of lead or other metallic materials of high atomic numbers may be chosen. In order to avoid electrically interfering with the X-ray image capture panel 40, an insulating dielectric material 85, such as Mylar may be positioned between X-ray image capture panel 40 and the radiation shield 37.

Alternately, radiation shield 37 may be positioned above and displaced a small distance, for example 2 millimeters above the image capture panel 40 in which instance an insulating dielectric material is not needed.

Shield 37 may be constructed integral with the panel or may be retrofitted by placing it over the panel and either simply laying it thereon during use or preferably affixing it to the panel with glue and the like.

Figure 4:
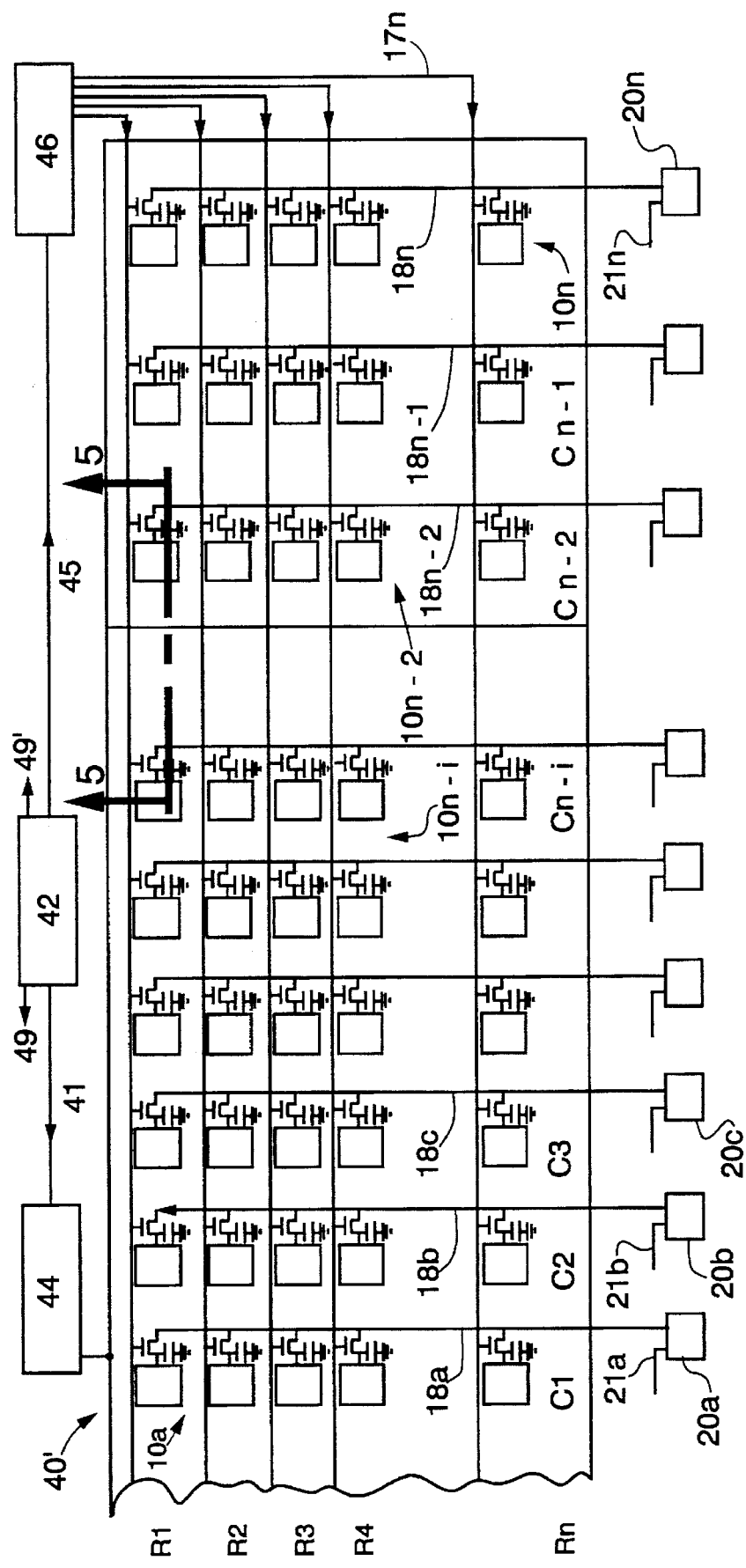
FIG. 4 is a simplified schematic representation of a second embodiment of a radiation detecting panel for use with the noise reduction circuitry and process in accordance with the present invention.

FIG. 4 shows an alternate and preferred embodiment of a panel 40' comprising a plurality of radiation detection elements 10a . . . 10n. This panel and associated circuitry is identical with the panel 40, and associated circuitry depicted and described in connection with FIG. 2. The difference is that, as better shown in the schematic elevation cross section of panel 40' taken along view lines 5—5, at least one and preferably three columns of detector elements are rendered insensitive to incident radiation by the omission of certain essential operative layers from the element structure.

Figure 5:
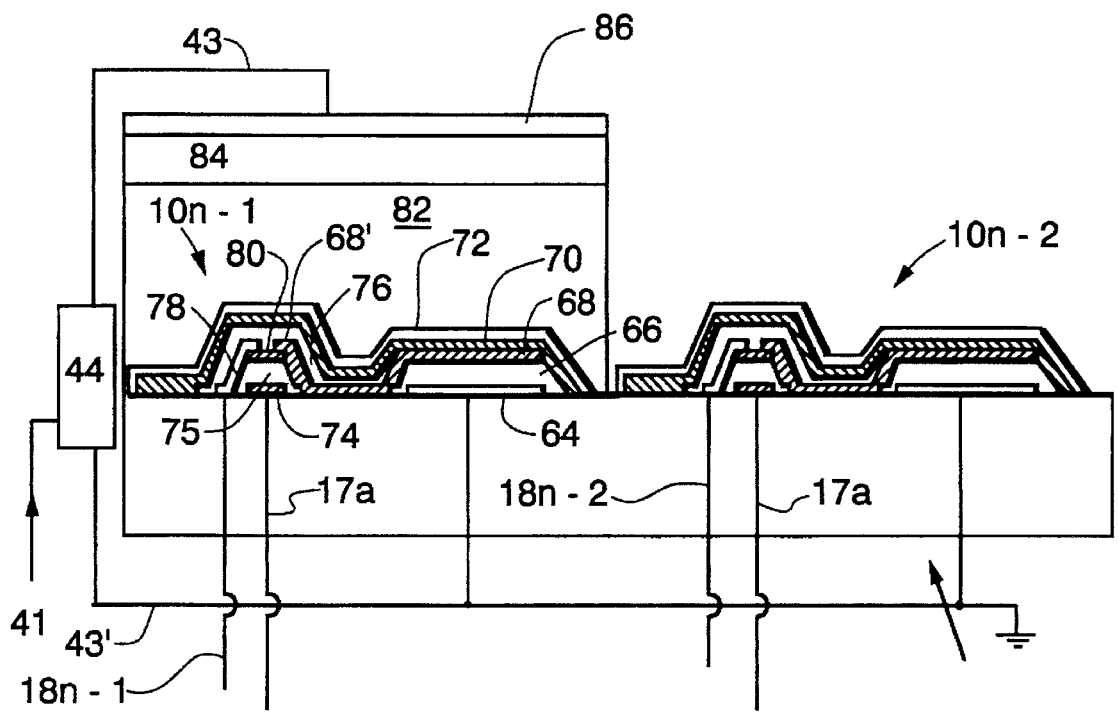
FIG. 5 is a schematic representation of a cross section of a portion of the panel shown in FIG. 4 along lines "5"—"15".

As shown in FIG. 5, the glass support of panel 40' also supports a number of detection elements. However, detection element 10n-2 differs from detection element 10n-i in that the photoconductive layer 82 does not extend over element 10n-2, (and also elements 10n-1 and 10n). Neither does the charge blocking layer 84 or the top electrode 86 extend over these detection elements. As a result these elements are not responsive to incident radiation.

FIG. 5 illustrates an instance where all three layers 82, 84 and 86 are omitted. The same result may be obtained by omitting only top conductive layer 86, since in the absence of this layer no charge may be deposited in charge accumulator 14 (formed by the conductive electrode 64, dielectric 66 and microplate 68) for the reasons explained in the aforementioned U.S. Pat. No. 5,319,206.

The operation of the system to retrieve data stored in the detection elements and consequently in the panel, and particularly to obtain data substantially free from switching noise in the integrating amplifier and common mode noise in the lines in a panel comprising a plurality of such detection elements, will next be described, first with reference to FIGS. 1 and 6.

As shown in FIG. 1 radiation detection element 10 comprises a sensor 12 which as a result of a desired event such as exposure to radiation, which, for purposes of illustration, is X-ray radiation, causes a charge whose magnitude is proportional to the intensity of the radiation, to accumulate in capacitor 14. The particular details of the operation of a sensor for detecting X-ray radiation and the mechanism for generating and for storing a charge in capacitor 14, are given in the aforementioned article "The Physics of a new direct digital X-ray detector" by Lee et al. and in U.S. Pat. No. 5,319,206 also by Lee et al.

The accumulated charge in capacitor 14 is read out by transferring it to readout module 20 as follows.

Enable/reset switch 24 is normally closed, that is, it is in the reset position. To read the stored charge in capacitor 14, signal generator 34 sends an enable pulse A at time $t_1$ over line 23. Pulse A actuates switch 24 and sets it to the off position. This enables integrating amplifier 22 which now begins to integrate any charges appearing at its input. These charges include any charges due to any transients as a result of the pulse actuating switch 23. Any such transients are enable/reset switch noise components and will appear in the integrator output signal with any data read-out signal, unless removed. Signal generator 34 next sends a first sampling pulse "C" at a time t2, wherein t2>t1. First sampling pulse "C" transmitted over line 25 actuates switch 26, sampling the output of integrator 22 and storing the sampled output in first sample and hold capacitor 28. Pulse "C" is a brief duration pulse lasting for a time t3–t2. When switch 26 is turned off sample and hold circuit 27 holds in capacitor 28 whatever the output of integrating amplifier happens to be at t3.

Signal generator 34 next outputs a gate address signal, voltage pulse "B", over line 17 beginning at a time t4, with t4>t3. The gate signal is applied to the gate of FET switch 15 and connects capacitor 14 to the input of the integrating amplifier 22 transferring the charge accumulated in the capacitor to the amplifier. Pulse "B" is timed to last sufficiently long to assure substantially complete transfer of all charges stored in capacitor 14 to the integrating amplifier, typically ten or more time constants. The gate pulse is removed after a time t5, disconnecting capacitor 14 from integrator 22. A second sample and hold pulse "D" which is next sent from the signal generator over line 35 to switch 30. Pulse "D" begins at a time t6 and ends at a time t7, with both t6 and t7 occurring after the gate pulse has ended at t5. As a result the output of integrator 22 is sampled again for a second time and the output is stored in the second sample and hold circuit 31. The second sample and hold circuit now contains a signal which is a combination of the enable/reset generated noise and the radiation data signal from the radiation sensor charge accumulator.

Figure 6:
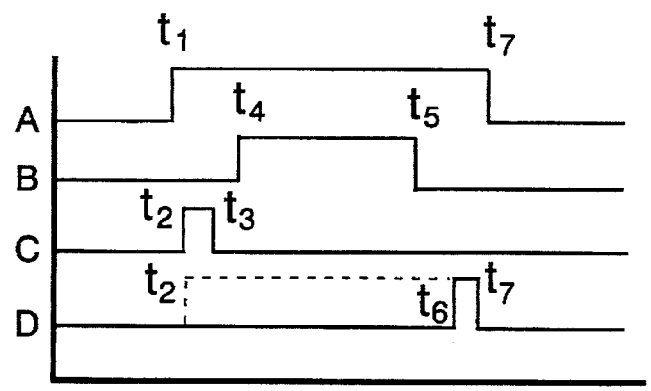
FIG. 6 is a representation of the timing sequence for the different control signals used in practicing the present invention.

In a preferred operating mode, shown in dotted line in FIG. 6, pulse "D" is initiated at time t2 simultaneously with pulse "C" and left on until a time t7 after the termination of the gate pulse "B". This is possible since the sample and hold circuits used simply follow the integrator output and only store the output of the integrator at the time of the end of the sampling pulse, i.e. at the termination of the switching pulses "C" and "D" respectively. Thus any noise due to the initiation of this pulse is also stored in the first sample and hold circuit and will also appear with the radiation data signal.

Following the above sequence of pulses, the reset/enable pulse may be terminated and the system reset.

However, there are now two signals present at the two outputs of the read-out module 20, one in the first sample and hold circuit representing only noise components, and one in the second sample and hold circuit representing a signal containing both the noise components and the radiation exposure data resulting from reading out the charge in capacitor 14. The two signals appear in outputs 29 and 33 respectively.

Subtraction of the signal in the first sample and hold circuit from the signal in the second sample and hold circuit results in a radiation data signal substantially free from enable/reset switching noise.

This can be done either in analog form as by using a differential amplifier connected to the two outputs (as shown in FIG. 3) or by converting the signal to a digital signal and performing digital subtraction.

The same method, as modified to accommodate a situation where a plurality of such sensors, as discussed before are used to form a panel comprising a plurality of sensors connected in rows and columns shown in FIG. 3, is practiced as follows to further reduce noise in the read-out signal from such a panel.

The panel shown in FIG. 3 operates to capture a radiation intensity pattern representing an image in the form of stored charges of different magnitudes stored in a plurality of interconnected charge accumulators of a plurality detection elements $10a \ldots 10n$ arranged in rows R1, R2, R3, R4 Rn and in columns C1, C2, ... Cn-i, ... Cn-2, Cn-1, Cn. The stored charges are proportional to the intensity of the radiation intensity incident on each sensor $10a \ldots 10n$ and to reconstruct an image the stored charges are read-out sequentially using either a programmed computer, a CPU, or a timing circuit to control a plurality of multiplexing circuits as is well known in the art.

In operation, a voltage is applied to the panel through programmable power supply 44 controlled from control circuit 42, and the panel is exposed to the desired event, i.e. image wise modulated X-ray radiation resulting in a plurality of stored charges in the plurality of capacitors 14 for each element.

As seen in FIG. 2, all detection elements $10a \ldots 10n$ have their capacitors 14 connected through switches 15 in columns C1 etc. through lines $18a \ldots 18n$ each line terminating in a read-out module 20 which operates in the manner described above with respect to the single element of FIG. 1. Similarly, all gates 16 of FET switches 15 of all elements in each row R1, R2 ... Rm, are connected to a gate address line $17a \ldots 17m$, and all gate address lines are connected to multiplexing circuit 46 which is controlled from control circuit 42.

Control circuit 42 through multiplex circuit 46 addresses sequentially lines $17a \ldots 17m$, applying a gate pulse signal "Bj" (where j is any one line number) to the whole line. Control circuit 42 also controls the pulse sequences "Aa" through "An", "Ca" through "Cn" and "Da" through "Dn" in the read-out modules $20a \ldots 20n$. Each module operates in the same manner as described earlier in conjunction with the description of the operation of the circuit of FIG. 1, to produce two outputs which when subtracted give a signal which is free of enable/reset switching noise for each of the elements in a row Rj being addressed through line $17j$.

The outputs $29a/33a \ldots 29n-1/33n-1$, of the read-out circuits $20a \ldots 20n$-i, are selected in a preselected sequence which permits identification of each data signal origination pixel for subsequent image reconstruction, through multiplexing circuit 48 under the control of controller 42, and subtracted in first subtracting circuit 50. Such multiplexing and image reconstruction is known technology, and of no particular significance in this case. Typically, the output from first subtraction circuit 50 will be converted to a digital image and processed for display through a computer.

The panel of FIG. 2 however is capable of further noise reduction in the radiation data signal, by reducing the common mode noise present in the signal arriving from the charge accumulators to the integrating amplifiers.

As shown in FIG. 2, a number of columns of sensors $10i$ are covered by a radiation opaque shield 37. Preferably 3 or more columns are covered, but as few as one may be shielded. Also while the operation will be explained with reference to FIG. 2, a panel having the structure shown in FIG. 4 and 5 where columns of sensors are rendered insensitive to incident radiation by the omission of at least one of the essential layers for the generation of the charges in the charge accumulator 14 may also be used, and will operate in the same manner as described in connection with the operation of the panel depicted in FIG. 2.

"Common mode" noise is common to a whole row of elements which appears as each row is addressed by the gate addressing signal over lines 17 and effects all switches 15 in the row addressed. This noise then appears in the signal output of the second sample and hold signal output of each read-out module for each column and is different for each line addressed.

Elimination to a large degree of this common mode noise in a panel is obtained using a shielded panel, or one where a plurality of elements have been rendered insensitive to the incident radiation, and the portion of the circuitry shown in FIG. 2 which is connected to columns Cn-2, Cn-1 and Cn, corresponding to the shielded elements.

Each of columns Cn-2, Cn1, and Cn are also connected to a read-out module 20n-2, 20n-1 and 20n. However the outputs of these modules are not connected to or addressed by the multiplexor 48.

Since there is no incident radiation signal charge generated in the accumulators 14 of the detection elements in the shielded columns, any output appearing at the output of the second sample and hold circuit of these read-out circuits 20n-2, 20n-1 and 20n, will be the result of common mode noise in the addressed line 17j. This noise is segregated from the enable/reset switch noise by subtraction of the first sample and hold circuit output from the second sample and hold circuit output, in second subtraction circuits 52, 53, and 54 using the same operation and timing pulse sequence as is done for the remaining read-out modules 20a . . . 20n-i (where i=3) to obtain a common mode indicative noise.

If only one inoperable, i.e. shielded, column is used, then there is only one output representing the common noise from an addressed line and this value is subtracted directly from the output of first subtracting circuit 50 for each of the remaining column outputs as each is addressed by the multiplexor 48.

The selection of three or more shielded or radiation insensitive element in a row to determine the common mode noise component minimizes the errors in signal correction that could arise in those instances when one of the shielded or insensitive elements is defective, or temporarily affected by transient noise sources that may exist in a radiation intensive environment. In a useful size, panel 40 contains millions of thin-film-transistor (TFT) based elements 10 and deficiencies in the manufacturing process are expected to produce a number of unwanted defective elements. For this reason, it is advantageous to use a process that is not erroneously affected by defective element, or transient noises to determine which single value from among the spurious noise values should be subtracted from the radiation data signal values captured in the non shielded or radiation sensitive elements. A preferred process is adapted so as to take into account and discard any out of line noise signals arising from defective elements 10n, or temporarily affected by transient noise sources.

When more than one columns are shielded or rendered insensitive, the common mode noise signal at the output of logic circuit 56 may be an arithmetic average value of the individual input values of common mode noise signals from each column.

Preferably, three columns are shielded, and the middle amplitude noise signal is selected as the most accurate signal in the logic circuit 56 and applied to correct the readout output signal from subtractor 50. However, any other selection method as may be appear statistically to produce the best value for the common noise component for each addressed line may also be used to generate the output of logic circuit 56.

The signal now appearing at the output of subtractor 58 is indeed a signal which is substantially free from both integrator amplifier switching noise and line addressing common mode noise. This noise free read-out output signal is next used in well known equipment such as a programmed computer, identified as a box 60 to store, reconstruct and display an image representing the intensity pattern of incident radiation (or other desirable event detected by the detection elements) on a detection panel comprising a plurality of detection elements.

In the preferred mode the detection elements and panel comprise elements adapted to detect incident X-ray radiation and to generate a charge proportional to the incident radiation intensity. However the process of noise elimination described and claimed by the present invention is not limited to the detection of incident X-ray radiation, but is applicable in all instances where one desires to read-out data stored as a charge in a charge accumulator, particularly where such data will be read-out in a sequential, scanning operation involving a multiplicity of timed switching pulses which tend to generate transient switching related noise that appears as an integral part of the data read-out signal.

Those skilled in the art having the benefit of the teachings of the present invention as hereinabove set forth, can effect numerous modifications thereto. These modifications are to be construed as being encompassed within the scope of the present invention as set forth in the appended claims.

I claim:

1. A detection panel comprising
   1) a plurality of detection elements arranged in rows and columns, each of said elements comprising:
      a sensor,
      a charge accumulator connected to the sensor, and
      a read-out switch,
      wherein at least one of said detection elements is insensitive to incident radiation;
   2) a plurality of read-out modules, each of said modules comprising:
      an amplifier including a reset/enable switch,
      a first sample and hold circuit for selectively sampling and holding said amplifier output
      a first time; and
      a second sample and hold circuit for selectively sampling and holding said amplifier output a second time, and
   3) a control signal source comprising a signal generator which generates:
      i) a read-out switch actuating signal,
      ii) an amplifier reset/enable switch actuating signal, and
      iii) a sample and hold signal;
wherein, the plurality of elements in each column are all connected to one read-out module and the plurality of elements in each row are all connected to a common gate line, and an output of the read-out module comprises a first sample and hold output and a second sample and hold output.

2. The detection panel according to claim 1 further comprising a first subtracting circuit connected to each of the plurality of the readout modules for subtracting said first sample and hold output from said second sample and hold output.

3. The panel according to claim 2 wherein at least three columns of detection elements are rendered insensitive to incident radiation by shielding the sensors in said columns from incident radiation, and wherein the output of the read-out modules connected to said radiation shielded columns is each connected to a second subtracting circuit, the second subtracting circuits are connected to a logic circuit and an output from said logic circuit and the output from said first subtracting circuit are applied to a third subtracting circuit.

4. The panel according to claim 3 wherein the logic circuit selects and outputs a signal representing an average value of signals at the output of the second subtracting modules.

5. The panel according to claim 3 wherein the logic circuit selects and outputs a signal representing a middle amplitude value of signals at the output of the second subtracting modules.

6. The detection panel according to claim 1 further comprising multiplexing circuitry connected to said plurality of read-out modules and a first subtracting circuitry connected to said multiplexing circuit, and wherein the control signal generator also generates and applies a multiplexing control signal to the multiplexing circuitry for sequentially applying the output of each read-out module to said first subtracting circuitry.

7. The panel according to claim 6 wherein a column of detection elements is insensitive to incident radiation and the output of the read-out module connected to this column is connected to a second subtracting circuit, and wherein the output of the first subtracting circuit and the output of the second subtracting circuit are applied to a third subtracting circuit.

8. The panel according to claim 6 wherein at least three columns of detection elements are insensitive to incident radiation and wherein the output of the read-out modules connected to said radiation insensitive columns is each connected to a second subtracting circuit, the second subtracting circuits are connected to a logic circuit and an output from said logic circuit and the output from said first subtracting circuit are applied to a third subtracting circuit.

9. The panel according to claim 8 wherein the logic circuit selects and outputs a signal representing a middle amplitude value of signals at the output of the second subtracting circuits.

10. The panel according to claim 8 wherein the logic circuit selects and outputs a signal representing an average value of signals at the output of the second subtracting circuits.

11. The panel according to claim 1 wherein at least one element in each row is insensitive to incident radiation.

12. The panel according to claim 1 wherein the at least one of said plurality of detection elements is rendered insensitive to incident radiation by shielding the sensor from incident radiation.

13. A method for removing noise components in reading radiation induced charges stored in a charge accumulator of a radiation detection element of a detection panel comprising a plurality of detection elements arranged in a plurality of rows and columns, wherein at least one detection element contains no such radiation induced charges, each detection element also including a read-out switch having an actuating gate electrode and a data electrode, the gate electrodes of all switches in a row connected to a gate line and the data electrodes of all read out switches in a column connected to a data line, the data line connecting each column to a read-out module each module comprising a charge integrating amplifier, and an enable/resetting switch associated with said amplifier, the method comprising:

A) addressing the enable/reset switches of all read-out modules with a first, enable signal allowing each of said integrating amplifiers to integrate any charge at its input, and while said enable switch remains enabled;

B) sampling and storing the output of said integrating amplifier as a first sample and hold signal for each read-out module;

C) transferring any accumulated charges from said charge accumulators in all elements in a row to the integrating amplifiers of the read-out modules in each column;

D) terminating the transfer of said charges and again sampling the integrating amplifier outputs to obtain an amplifier output for each read-out module;

E) subtracting the first sample and hold signal from the amplifier output in each read-out circuit, to obtain a data read-out signal indicative of the relative intensity of the radiation exposure of the elements in a row, such signal being substantially free of enable/reset switching noise; and F) subtracting the data read-out signal from the readout module connected to the detection element which contains no radiation induced charges from each of the radiation data output of the read-out modules connected to the remaining elements, to produce a radiation data output free from both enable/reset switching noise and common mode noise.

14. The method according to claim 13 wherein the detection elements in at least one column contain no such radiation induced charges and wherein in step "F" the data read-out signal subtracted is the data read-out signal from the read-out module connected to the column which contains no radiation induced charges.

15. The method according to claim 13 wherein the detection elements in a plurality of columns contain no such induced charges and wherein in step "F" the read-out signals from the read-out modules connected to the columns which contain no radiation induced charges are further processed before the subtraction step.

16. The method in accordance with claim 15 wherein three columns contain no radiation induced charges and the further processing comprises selecting a middle amplitude signal from the signals from the read-out modules of the columns wherein the detection elements contain no radiation induced charges.

17. The method in accordance with claim 15 wherein three columns contain no radiation induced charges and the further processing comprises selecting a median amplitude signal from the signals from the read-out modules of the columns wherein the detection elements contain no radiation induced charges.

18. The method in accordance with claim 15 wherein the further processing comprises averaging the signals from the read-out modules of the columns in which the detection elements contain no radiation induced charges.

19. A method for removing noise components in reading radiation induced charges stored in a charge accumulator of a radiation detection element of a detection panel comprising a plurality of detection elements arranged in a plurality of rows and columns, wherein at least one detection element is insensitive to and contains no such radiation induced charges, each detection element also including a read-out switch having an actuating gate electrode and a data electrode, the gate electrodes of all switches in a row connected to a gate line and the data electrodes of all read out switches in a column connected to a data line, the data line connecting each column to a read-out module each module comprising a charge integrating amplifier, and an enable/resetting switch associated with said amplifier, the method comprising:

A) transferring any accumulated charges from said charge accumulators in all elements in a row to the integrating amplifiers of the read-out modules in each column;

B) terminating the transfer of said charges and sampling the integrating amplifier outputs to obtain an amplifier output signal for each read-out module; and C) subtracting the amplifier output signal from the readout module connected to the detection element which contains no radiation induced charges from each of the integrating amplifier output signals of the read-out modules connected to the remaining elements, to produce a radiation data output free from common mode noise.

20. The method according to claim 19 wherein the detection elements in at least one column are insensitive to and contain no such radiation induced charges, and wherein in step "C" the integrating amplifier signal subtracted is the integrating amplifier signal from the read-out module connected to the column which contains no radiation induced charges.

21. The method according to claim 19 wherein the detection elements in a plurality of columns are insensitive to and contain no such induced charges, and wherein in step "C" the integrating amplifier output signals from the read-out modules connected to the columns which contain no radiation induced charges are further processed before the subtraction step.

22. The method in accordance with claim 21 wherein three columns are insensitive to and contain no radiation induced charges, and the further processing comprises selecting a middle amplitude signal from the amplifier output signals from the read-out modules of the columns wherein the detection elements contain no radiation induced charges.

23. The method in accordance with claim 21 wherein three columns are insensitive to and contain no radiation induced charges and the further processing comprises selecting a median amplitude signal from the amplifier output signals from the read-out modules of the columns wherein the detection elements contain no radiation induced charges.

24. The method in accordance with claim 21 wherein the further processing comprises averaging the amplifier output signals from the read-out modules of the columns in which the detection elements contain no radiation induced charges.

25. A detector comprising an event detection element, a read-out module connected thereto, and a control signal source connected to both the detection element and the read-out module, wherein:
1) the detection element comprises:
   a sensor,
   a charge accumulator, and
   a read-out switch;
2) the read-out module comprises:
   an integrating amplifier having an input terminal, an output terminal, and a reset/enable switch,
   a first sample and hold circuit for selectively sampling and holding a first output of said amplifier, and
   a subtraction circuit connected to the amplifier output terminal and the first sample and hold circuit for subtracting the first output of the integrating amplifier in said sample and hold circuit from a subsequent output of said amplifier; and
3) the control signal source comprises:
   a control signal generator for generating and applying in the following order:
   i) an enable signal for setting said enable/reset switch in the enable position to begin integrating charges appearing at the input of said integrating amplifier to generate an output proportional to said charges,
   ii) a first sampling signal for actuating said first sample and hold circuit to sample the integrating amplifier output a first time and hold said first output, and
   iii) a readout signal for actuating the read-out switch.

26. The detector of claim 25 wherein the read-out module further includes a second sample and hold circuit for selectively sampling and holding said amplifier output a second time and the subtraction circuit is connected to the first and the second sample and hold circuits, and wherein the control signal generator also generates and applies to said second sample and hold circuit:
   iv) a second sampling signal for actuating said second sample and hold circuit to sample the integrating amplifier output a second time and hold said second output.

27. The detector of claim 26 wherein the sensor is an X-ray radiation sensor.

28. A detection panel comprising a plurality of detection elements, a plurality of read-out modules and a control signal source all in accordance with claim 25, wherein, the plurality of detection elements is arranged in rows and columns and wherein the plurality of elements in each column are all connected to one read-out module and the plurality of elements in each row are all connected to a common gate line and wherein the read-out signal is applied to the gate line.

29. A detection panel comprising a plurality of detection elements, a plurality of read-out modules and a control signal source all in accordance with claim 26, wherein, the plurality of detection elements is arranged in rows and columns and wherein the plurality of elements in each column are all connected to one read-out module and the plurality of elements in each row are all connected to a common gate line, and wherein an output of the read-out module comprises a first sample and hold output and a second sample and hold output.

30. The detection panel according to claim 29 wherein each read-out switch comprises an transistor switch having a gate electrode and a data electrode, and wherein all gates of all elements in one row are connected to the common gate line, and wherein all data electrodes of all elements in one column are connected to a common data line connected to the read-out module.

31. The detection panel according to claim 30 further comprising multiplexing circuitry connected to said plurality of read-out modules and a first subtracting circuitry connected to said multiplexing circuitry and wherein the control signal generator also generates and applies a multiplexing control signal to the multiplexing circuitry for sequentially applying the output of each read-out module to said first subtracting circuitry.

32. The panel in accordance with claim 31 wherein the output of the first subtracting circuitry is connected to a data storage and display device.

33. A method for removing a noise component in reading radiation induced charges stored in a charge accumulator of a radiation detection element of a detector comprising the detection element, a read-out module and a control signal source, wherein the detection element includes a read-out switch, and wherein the read-out module comprises a charge integrating amplifier, and an enable/resetting switch associated with said amplifier, the method comprising:
   A) addressing the enable/reset switch with a first, enable signal allowing said integrating amplifier to integrate any charge at its input, and while said enable switch remains enabled;
   B) sampling and storing the output of said integrating amplifier as a first sample and hold signal;
   C) transferring any accumulated charges from said charge accumulator to the integrating amplifier;
   D) terminating the transfer of said charges and again sampling the integrating amplifier output to obtain an amplifier output; and E) subtracting the first sample and hold signal from the amplifier output to obtain a data read-out signal indicative of the relative intensity of the radiation exposure of the element and substantially free of enable/reset switching noise.

34. The method according to claim 33 wherein in step D the amplifier output is sampled and stored as a second sample and hold signal and in step "E" the first sample and hold signal is subtracted from said second sample and hold signal.

35. A method for removing noise components in reading radiation induced charges stored in a charge accumulator of a radiation detection element of a detection panel comprising a plurality of detection elements arranged in a plurality of rows and columns, wherein the detection element includes a read-out switch having an actuating gate and a data electrode, the gate electrodes of all switches in a row connected to a gate line and the data electrodes of all read out switches in a column connected to a data line, the data line connecting each column to a read-out module each module comprising a charge integrating amplifier, and an enable/resetting switch associated with said amplifier, the method comprising:

A) addressing the enable/reset switches of all read-out modules with a first, enable signal allowing each of said integrating amplifiers to integrate any charge at its input, and while said enable switch remains enabled;

B) sampling and storing the output of said integrating amplifier as a first sample and hold signal for each read-out module;

C) transferring any accumulated charges from said charge accumulators in all elements in a row to the integrating amplifiers of the read-out modules in each column;

D) terminating the transfer of said charges and again sampling the integrating amplifier outputs to obtain an amplifier output for each read-out module; and E) sequentially subtracting the first sample and hold signal from the amplifier output in each read-out circuit to obtain a data read-out signal indicative of the relative intensity of the radiation exposure of the elements in a row, such signal being substantially free of enable/reset switching noise.

36. The process according to claim 35 wherein step "D" comprises sampling and store said amplifier output as a second sample and store signal in each read-out module and wherein in step "E" the first sample and hold signal is sequentially subtracted from the second sample and hold signal in each read-out module.

37. The process according to claim 36 wherein steps "A"–"C" occur simultaneously, and further comprising an additional step:

F) repeating steps "A" through "E" for each of the rows in the panel.

* * * * *

UNITED STATES PATENT AND TRADEMARK OFFICE
CERTIFICATE OF CORRECTION

PATENT NO. : 5,648,660
DATED : Jul. 15, 1997
INVENTOR(S) : Denny Lap Yen Lee, Eugene Francis Palecki, Cornell Lee Williams It is certified that error appears in the above-indentified patent and that said Letters Patent is hereby corrected as shown below:

In claim 1, on column 12, lines 37-38, delete the extra spacing between "output" and "a first time".

In claim 4, on column 13, line 3, replace "modules" with: --circuit--.

In claim 5, on column 13, line 7, replace "modules" with: --circuit--.

Signed and Sealed this

Twenty-fifth Day of November, 1997

Attest:

BRUCE LEHMAN

Attesting Officer

Commissioner of Patents and Trademarks